United States Patent [19]

Bayerer

[11] Patent Number: 5,705,848

[45] Date of Patent: Jan. 6, 1998

[54] POWER SEMICONDUCTOR MODULE HAVING A PLURALITY OF SUBMODULES

[75] Inventor: Reinhold Bayerer, Reichelsheim, Germany

[73] Assignee: Asea Brown Boveri AG, Baden, Switzerland

[21] Appl. No.: 562,454

[22] Filed: Nov. 24, 1995

[51] Int. Cl.[6] .................................................. H01L 29/00
[52] U.S. Cl. .......................... 257/500; 257/501; 257/723; 257/724
[58] Field of Search ................................ 257/691, 723, 257/724, 725, 500, 501

[56] References Cited

U.S. PATENT DOCUMENTS 5,559,374  9/1996  Ohta et al. ........................... 257/723

FOREIGN PATENT DOCUMENTS 0 205 746  12/1986  European Pat. Off. .
0 597 144 A1  5/1994  European Pat. Off. .

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

In the case of a power semiconductor module (34) having a plurality of submodules (37b), which are arranged next to one another on a common baseplate (35) and are electrically interconnected, and can be externally connected, on the power side in a low-inductance manner by means of conductors in the form of plates, a reduction in the space requirement is achieved by virtue of the fact that the conductors (40, 43) in the form of plates are each arranged in a self-supporting manner in planes above the submodules (37b), which planes have a vertical separation from one another and from the submodules (37b) which is sufficient for electrically insulation, and that the conductors (40, 43) in the form of plates are electrically connected to the individual submodules (37b) via additional, vertical conduction elements (38a,b, 42a–c). (FIGS. 4 and 7)

20 Claims, 7 Drawing Sheets

POWER SEMICONDUCTOR MODULE HAVING A PLURALITY OF SUBMODULES

TECHNICAL FIELD

The present invention is concerned with the field of power electronics. It relates to a power semiconductor module having a plurality of submodules, which are arranged next to one another on a common baseplate and are electrically interconnected, and can be externally connected, on the power side in a low-inductance manner by means of conductors in the form of plates.

PRIOR ART

Such a power semiconductor module is disclosed, for example, in EP-A1-0 597 144.

Power semiconductor modules having a hybrid structure, in which a plurality of individual semiconductors in chip form are arranged next to one another, and are interconnected, on a common baseplate and in a common housing, have been known for a long time (see DE-C-36 69 017, too).

Various requirements have to be met with such a module structure. On the one hand, the individual semiconductors have to be thermally closely coupled to the outer sides of the housing for the purpose of good cooling at high powers. On the other hand, the electrical connections inside the housing and to the outside for the power section have to be able to carry high currents and at the same time have to have a mutual separation or insulation sufficient to be able to cope with the sometimes high potential differences without any voltage flashovers. Furthermore, the structure and assembly of the module is to be as simple and economical as possible. Finally, with modern fast power semiconductors having short switching times, as embodied, for example, by the IGBTs (Insulated Gate Bipolar Transistors), it is becoming increasingly important to implement the electrical connections in a low-inductance manner in order to be able to utilize the fundamentally possible high current rise times of the semiconductor components in the module.

In order to be able to meet these requirements, the publication cited in the introduction has already proposed a hybrid power-electronic arrangement in which, in order to interconnect the submodules and to provide external connection, use is made of a stack arrangement of insulating material layers and conductor track layers which are layered alternately one above the other. This solution permits the realization of modules of very low inductance in conjunction with a simple and cost-effective structure and good functional reliability.

Nevertheless, this known module structure is not without problems: specifically, the insulating and conductor layers are recessed in the region of the submodules in order to permit bonding of the submodules to the surroundings (FIGS. 4, 5). The insulating and conductor layers are therefore constructed in the form of a lattice structure, the webs of the structure coming to lie between the submodules. One consequence of this is that additional surface area has to be provided for the interconnection by means of plates. For this reason, modules of this type require larger surface areas than other modules whose connections usually pass vertically upwards from the submodules and lead to the connection on the top side of the module.

DESCRIPTION OF THE INVENTION

The object of the invention, therefore, is to provide a power semiconductor module in which the disadvantage of a loss in surface area is avoided while retaining the advantage of low internal inductance and the advantage of the broad low-inductance external connection.

The object is achieved, in the case of a power semiconductor module of the type mentioned in the introduction, by virtue of the fact that the conductors in the form of plates are each arranged in a self-supporting manner in planes above the submodules, which planes have a vertical separation from one another and from the submodules which is sufficient for electrical insulation, and that the conductors in the form of plates are electrically connected to the individual submodules via additional, vertical conduction elements. As a result of the self-supporting arrangement of the broad conductors in the form of plates above the submodules, it is possible to arrange the submodules in a close-packed manner next to one another on the baseplate. This reduces the total base area required for the module without it being necessary to cede or impair the broad low-inductance connection and the low internal inductance associated with the broad conductors.

A first preferred embodiment of the power semiconductor module according to the invention is distinguished by the fact that the vertical conduction elements consist of sheet-metal strips which are bent more than once, preferably at right angles, and that the vertical conduction elements are bent in such a way that they can compensate for a thermally induced expansion of the submodules and/or of the baseplate parallel to the plane of the baseplate. This achieves a high stability under alternating load in conjunction with low inductance. At the same time, the use of the sheet-metal strips enables all of the connections between the submodules and the external connections to be implemented as soldered joints, with the result that, according to a development of this embodiment, the vertical conduction elements are soldered to the conductors in the form of plates and to the submodules.

A further preferred embodiment of the module according to the invention is characterized in that the central conductors of the conductors in the form of plates are provided with perforations through which are routed the vertical conduction elements for the connection of the submodules to the conductors in the form of plates situated above them. This achieves a simple structure which is of low inductance and at the same time saves space.

Partial discharge problems between the conductors in the form of plates and at different potentials are reliably avoided if, according to a further embodiment, the submodules together with the associated conductors in the form of plates and the vertical conduction elements are arranged in a housing and are potted with an electrically insulating compound.

Further embodiments emerge from the dependent claims.

BRIEF EXPLANATION OF THE FIGURES

The invention will be explained in more detail below using exemplary embodiments in conjunction with the drawing, in which.

3

Figure 3:
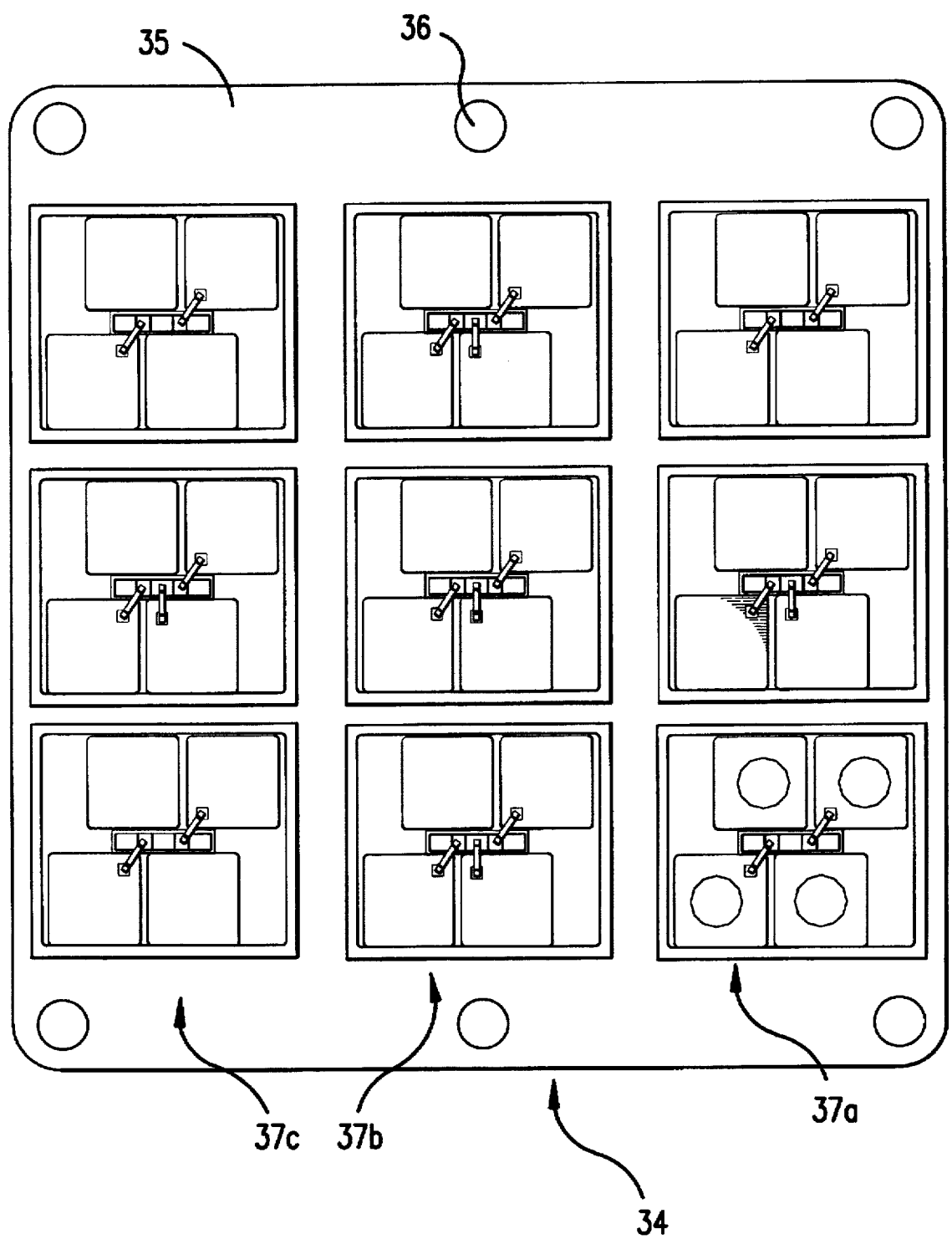
FIG. 3 shows a plan view of an exemplary embodiment of a power semiconductor module according to the invention with 9 submodules (without the power connections) arranged on a baseplate.
Figure 4:
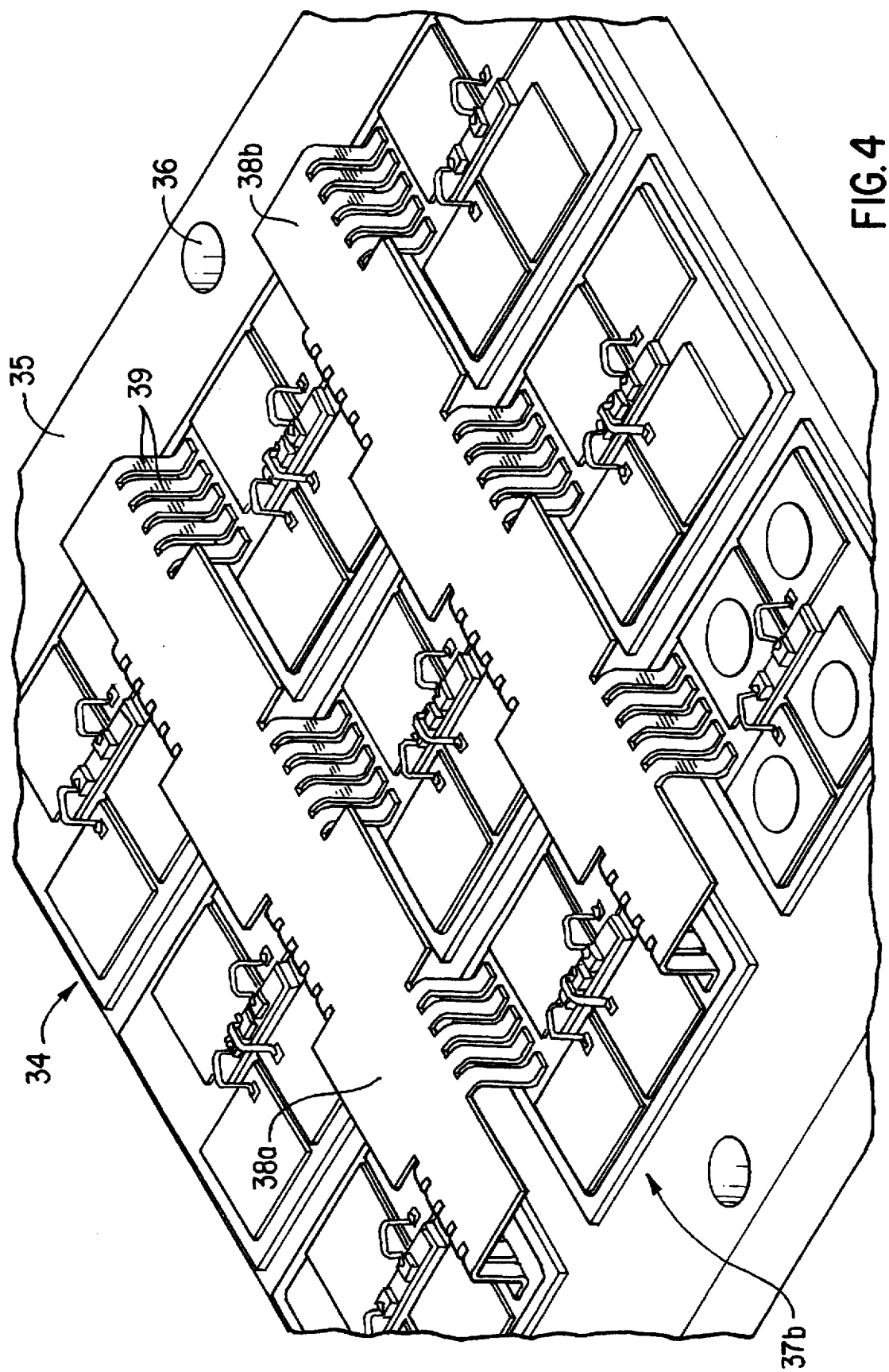
Figure 5:
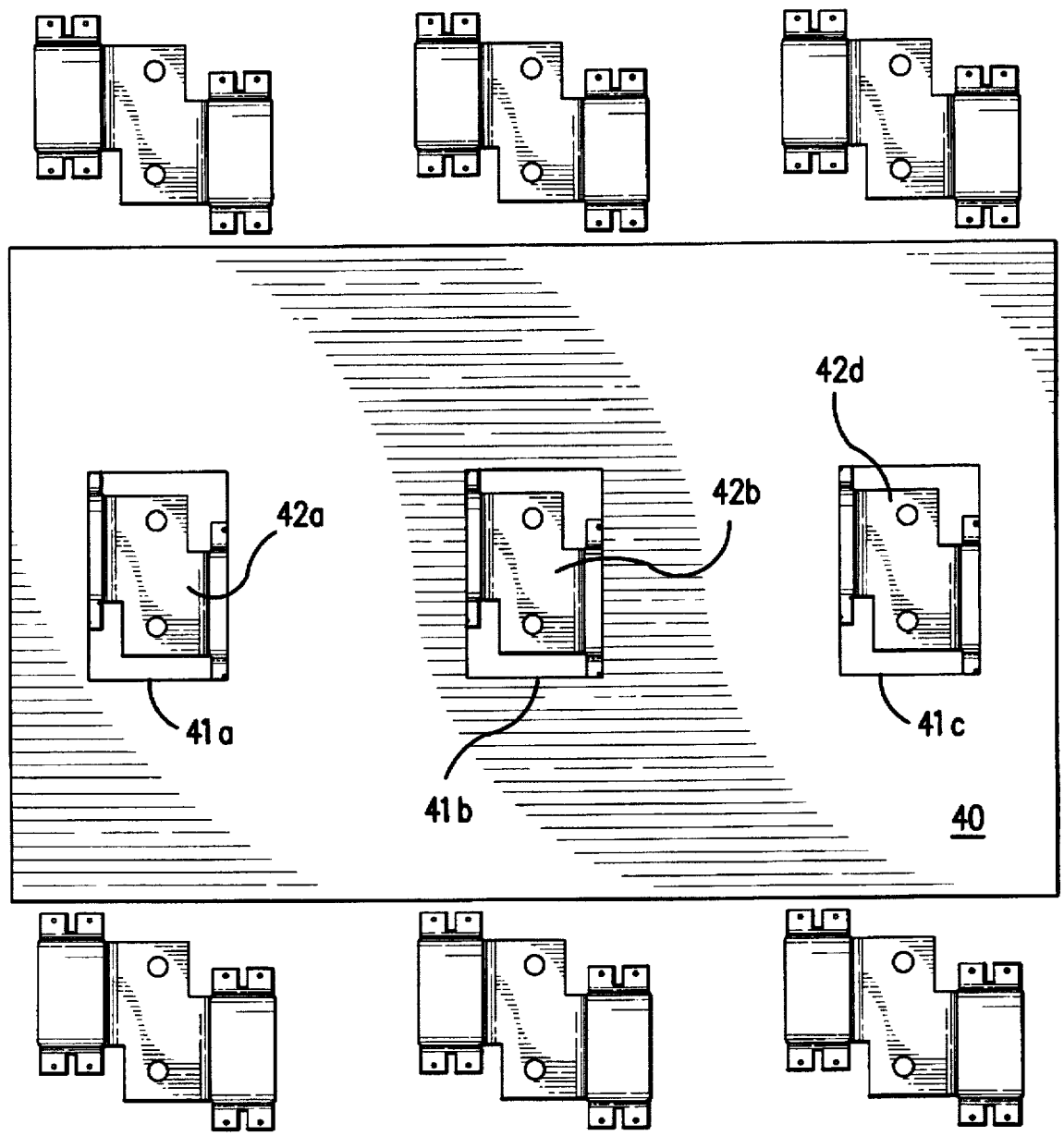
Figure 6:
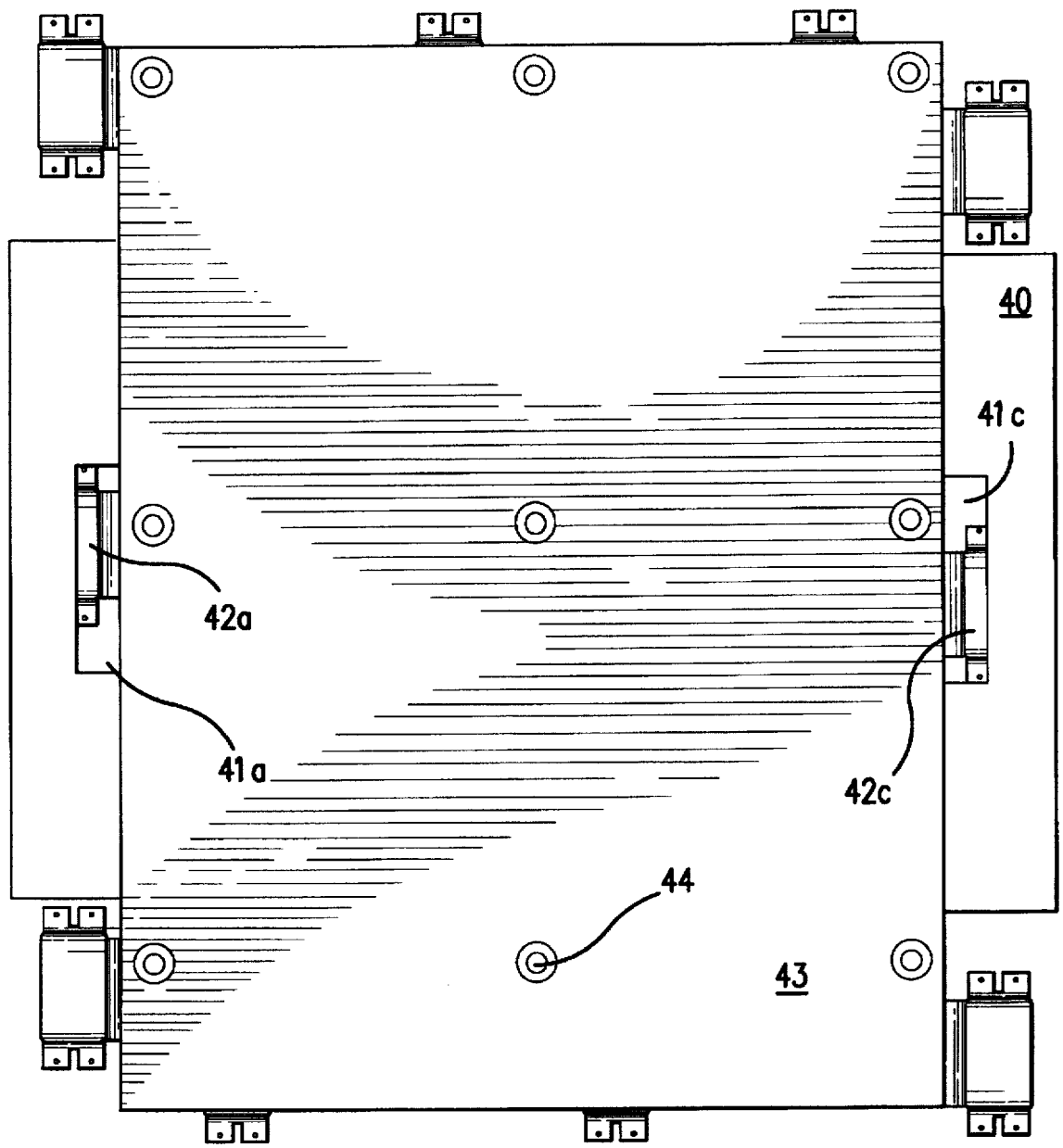
Figure 7:
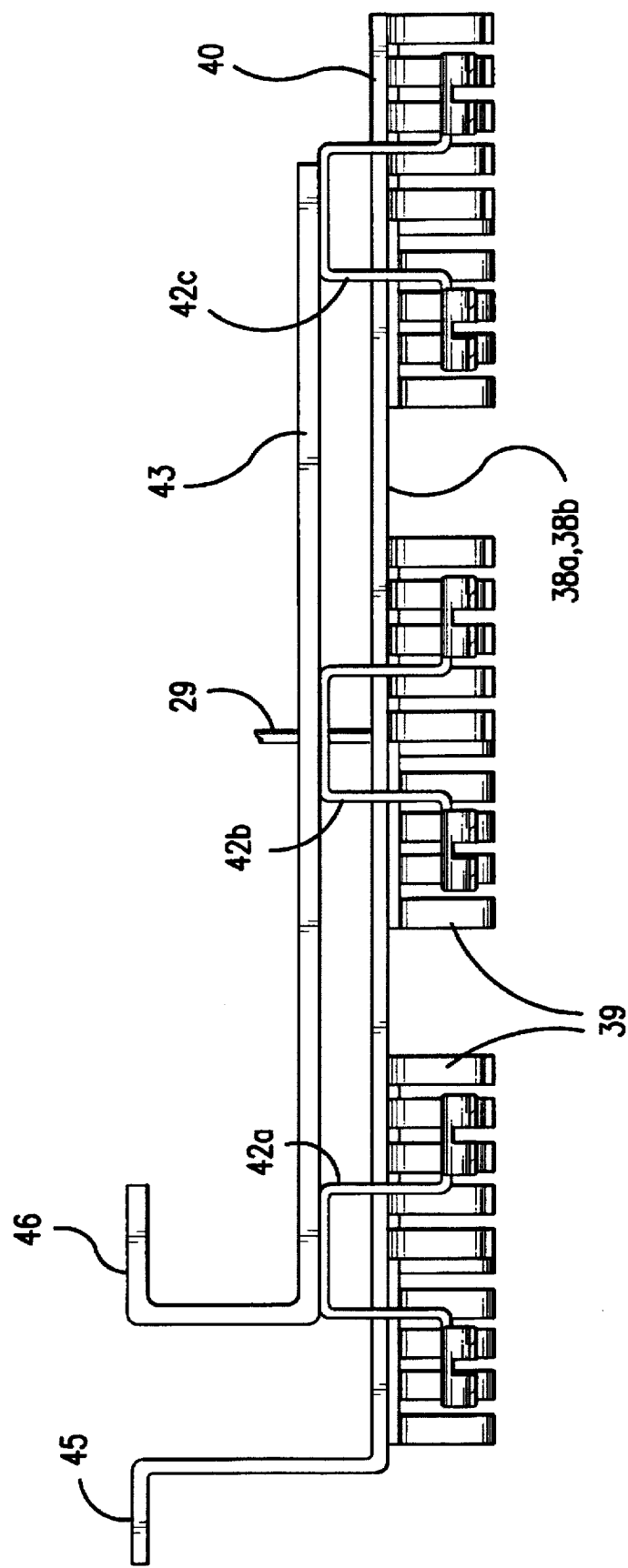

FIG. 4 shows a perspective view of the module of FIG. 3 with vertical conduction elements in the form of collector clips;

FIG. 5 shows a plan view of the arrangement of the emitter clips for a module according to FIGS. 3 and 4 and of an exemplary collector plate for connection to the collector clips of FIG. 4;

FIG. 6 shows a plan view of the arrangement of FIG. 5 with an additional exemplary emitter plate, which partly covers the collector plate and is connected to the emitter clips; and FIG. 7 shows a diagrammatic side view of the arrangement of the emitter clips, of the collector clips, of the collector plate and of the emitter plate of a module according to FIG. 6.

WAYS OF IMPLEMENTING THE INVENTION

FIG. 3 illustrates a basic diagram of an exemplary embodiment of a power semiconductor module 34 according to the invention, in plan view. A plurality of submodules—in this example 9—are arranged in a close-packed manner next to one another on a common baseplate 35, which is provided at its edge with fastening holes 36. For the sake of simplicity, only the three lowest submodules are provided with reference symbols 37a, 37b and 37c. The structure of an individual submodule is represented by way of example in FIG. 1. The submodule 10 comprises a (ceramic) substrate 11 which is covered with a large-area metallization layer 12 on one side (the top side). The metallization layer 12 is continuous and has no conductor track structures. It serves to accommodate the power semiconductor chips and the tabs for making contact with the chips on the underside.

Figure 1:
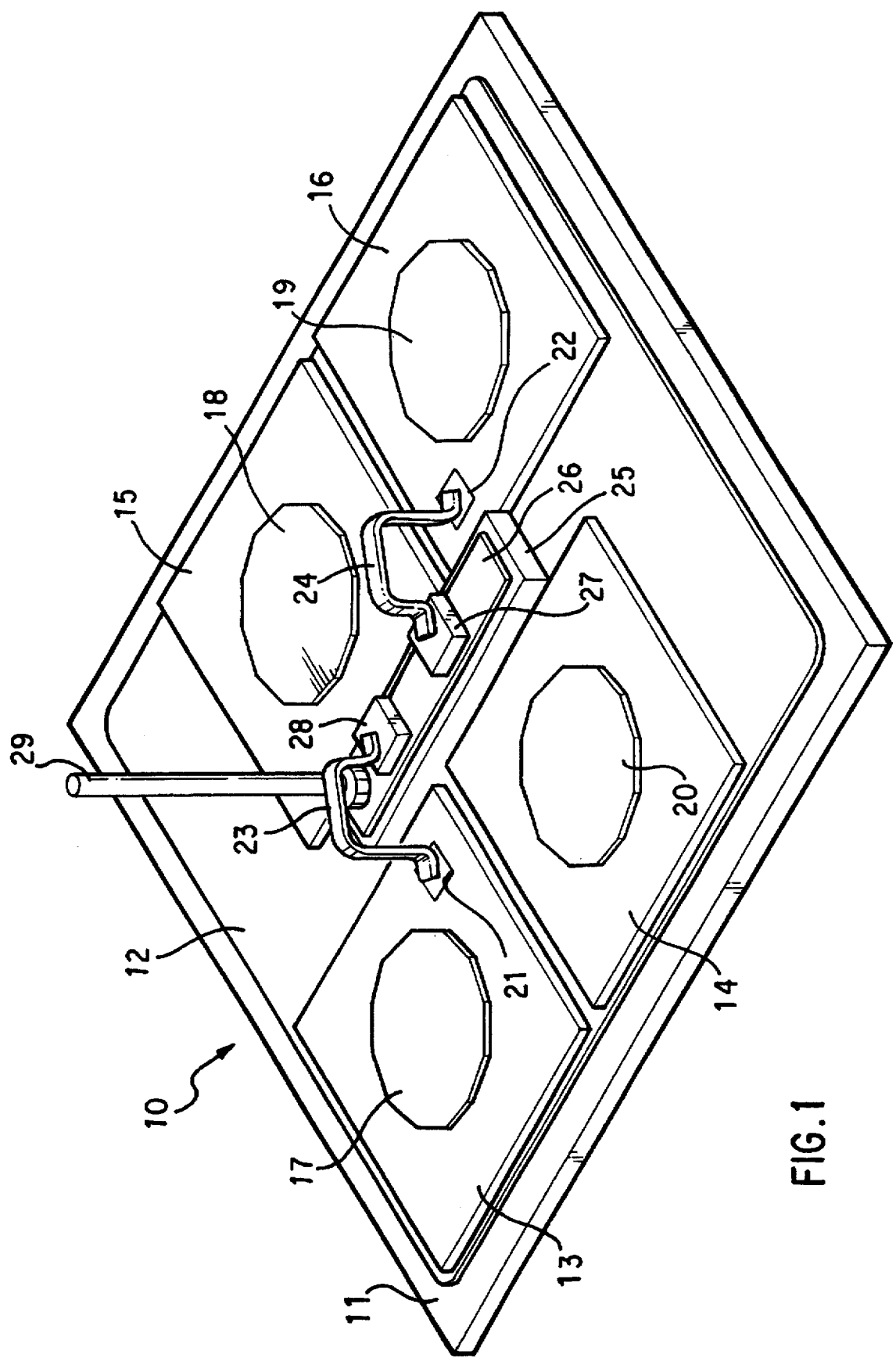
FIG. 1 shows a perspective view of an exemplary embodiment of a submodule which is used in a power semiconductor module according to the invention.

In the example of FIG. 1, two IGBTs 13, 16 and two diodes 14, 15 are accommodated on the substrate 11. The collector of the IGBTs 13, 16 is situated on the underside of the associated chips and can be connected via the solderable metallization layer 12 of the submodule 10. For this purpose, areas of the metallization layer 12 are left bare next to each of the diodes 14, 15 and corresponding vertical conduction elements can be soldered onto said areas (FIG. 4). The same applies to the cathodes of the diodes 14, 15. Arranged on the top sides of the chips are the emitters in the case of the IGBTs 13, 16 and the anodes in the case of the diodes 14, 15. A respective metal disk 17, 19 and 18, 20 is soldered on for connection purposes (only the metal disks of the submodule 37a are illustrated in FIG. 3). The gates 21, 22 of the IGBTs 13, 16 are likewise situated on the top side of the chips. They are connected via soldered gate clips 23, 24 to corresponding gate resistors 27, 28 which are arranged on a common gate block or gate runner 25 and run together there. The elongate gate runner 25 is situated between the chips, likewise on the substrate 11 of the submodule, and comprises a substrate covered with a metallization layer 26. The connection of the gates 21, 22 is passed upwards from the gate runner 25 using a soldered-on connecting wire 29.

Figure 2:
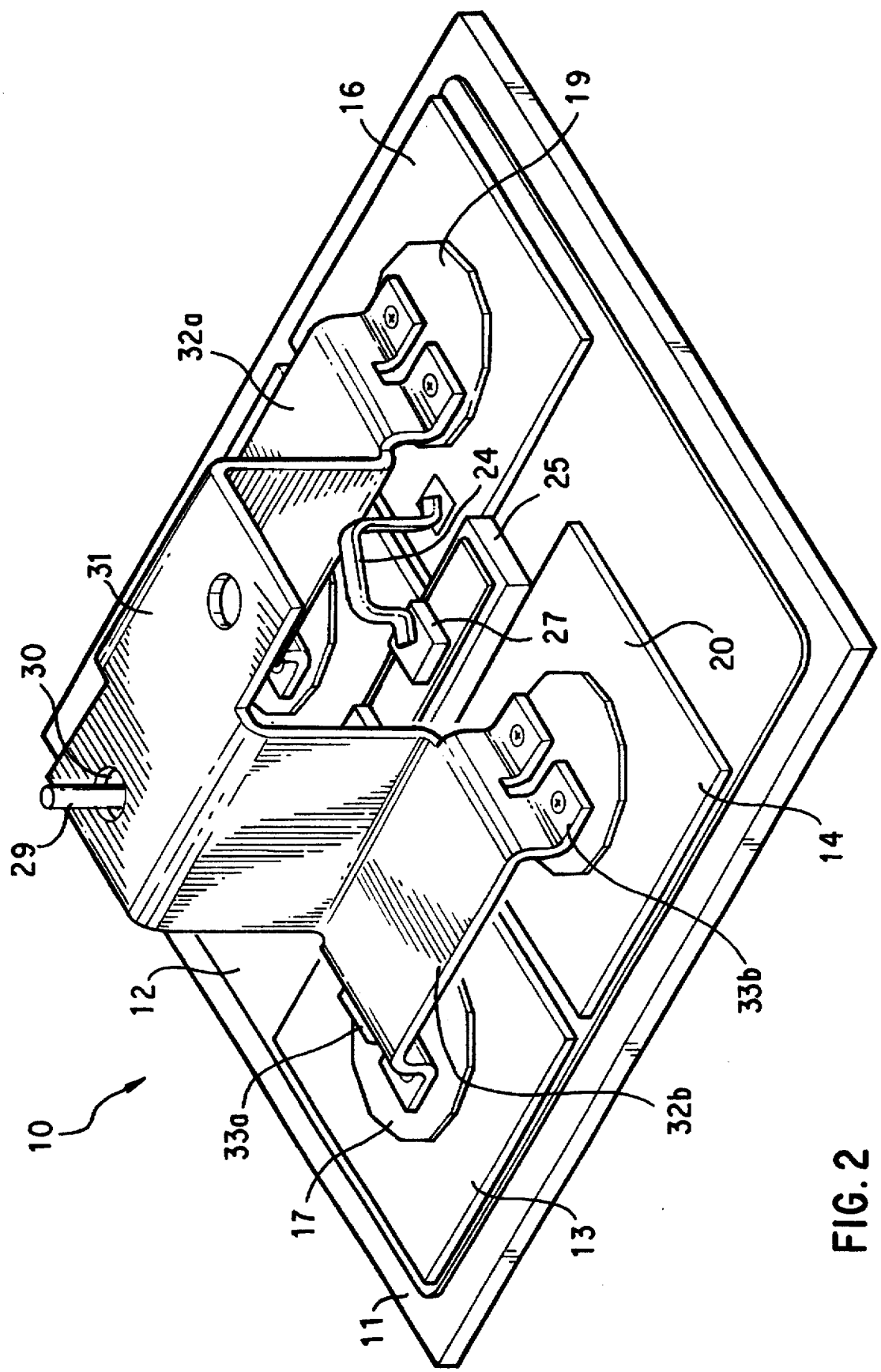
FIG. 2 shows the submodule of FIG. 1 with a vertical conduction element in the form of an emitter clip.

All of the IGBT emitters and diode anodes of a submodule are mutually short-circuited and passed upwards together for connection purposes. To this end, one emitter clip 31 is provided for each submodule 10 according to FIG. 2. The emitter clip 31 consists of a sheet-metal strip which is bent in a U-shape. The legs of the U-shaped main body are bent outwards at right angles at their ends and each turn into a horizontal first tab 32a,32b. The dimensions are selected here in such a way that the inverted U freely straddles the gate runner 25 and the gate clips 23, 24, and the first tabs 32a,32b in each case extend between the metal disks 17 and

4

20 and, respectively, 18 and 19 of an IGBT 13 and 16 and of the adjacent diode 14 and 15. Second tabs 33a,33b are formed on the transverse sides of the first tabs 32a,32b by means of two right-angled bends, by which second tabs the emitter clip 31 is soldered onto the metal disks 17–20 of the semiconductor chips.

With the aid of the emitter clips 31, there is produced above the submodules a higher level for the connection (the soldering) of the emitters/anodes to a collective plate (emitter plate 43 in FIGS. 6, 7), that is to say an emitter layer arranged above them. By bending the first and second tabs 32a,32b and 33a,33b in mutually perpendicular directions, bending/elongation curves are produced which permit a wide variety of thermal expansions of the clips, of the ceramic, of the semiconductor chips and of the other components of the module to be compensated for in two mutually perpendicular directions. On account of their small width and their length, the gate clips 23, 24 soldered onto the gate runner 25 can easily be bent in all directions.

The connection of the collectors/cathodes and their connection to a higher collector plane takes place via collector clips 38a,38b according to FIG. 4. The collector clips 38a,38b consist of elongate sheet-metal strips, on the long sides of which groups of third tabs 39 are alternately bent twice at right angles. The third tabs 39 form soldering feet, by which the collector clips 38a,38b are soldered onto the free areas of the metallization layer of the individual submodules. As a result of the bending of the third tabs 39 and the subdivision into narrow segments, it is ensured in the case of the collector clips 38a,38b, too, that thermal expansions are reliably compensated for in two independent spatial directions.

The collector clips 38a,38b are each arranged between two rows of three submodules and interconnect these rows of three. According to FIG. 5, they are interconnected in the higher collector plane by means of a collector plate 40, which bears on the collector clips 38a,38b and is soldered thereto. Since the collector plane is lower than the emitter plane, the collector plate 40 is provided with perforations 41a–41c through which the emitter clips 42a–42c of the submodules situated underneath can extend into the higher emitter plane. According to FIG. 6, the nine emitter clips (FIG. 5) of the nine submodules are connected in the emitter plane by means of a continuous emitter plate 43, which bears on the emitter clips and is soldered thereto.

The structure of the connections with the different planes can be seen particularly well in the side view of FIG. 7. The plate stack 40, 43 does not comprise insulating and metal layers—as in the case of the module known from the publication cited in the introduction—but rather only metal layers. These metal layers are arranged above the submodules. The metal layers have a vertical separation from one another and from the submodules sufficient to be able to insulate a voltage of adequate magnitude after potting. Since insulating layers are avoided, the partial discharge problems connected with the associated bonding technology are also avoided. The open metal stack 40, 43 is potted (in a housing) and evacuated before the potting compound cures, in order that any air bubbles are avoided and the stack becomes free of partial discharges. The special configuration of the vertical connection elements 31, 38a,b and 42a,b with their bending/elongation curves and the various tabs 32a,32b, 33a,33b and 39 ensures that the soldering points between the plates 40, 43 and the submodules remain virtually free of mechanical stresses and do not experience ageing.

As already mentioned, the connection of the IGBT gates takes place via connecting wires 29 which are passed upwards. For this purpose, there are provided both in the individual emitter clips 31 and in the emitter plate 43 through holes 30 (FIG. 2) and gate bushings 44 (FIG. 6), respectively. According to FIG. 7, the external connection of the emitters and collectors expediently takes place via external connections 45, 46, which are integrally formed on the collector plate 40 and the emitter plate 43, respectively.

Overall, the invention yields a power semiconductor module that inductance in the interior and the supply lines, does not take up much space and has a simple structure and a high stability under alternating load.

LIST OF DESIGNATIONS

10 Submodule
11 Substrate
12 Metallization layer
13, 16 IGBT
14, 15 Diode
17–20 Metal disk
21, 22 Gate (IGBT)
23, 24 Gate clip
25 Gate runner
26 Metallization layer (gate runner)
27, 28 Gate resistor
29 Connecting wire (gate)
30 Through hole
31 Emitter clip
32a,b Tab (elongation compensation in the Y direction)
33a,b Tab (elongation compensation in the X direction)
34 Power semiconductor module
35 Baseplate
36 Fastening hole
37a–c Submodule
38a,b Collector clip
39 Tab
40 Collector plate
41a–c Perforation (emitter clip)
42a–c Emitter clip
43 Emitter plate
44 Gate bushing
45, 46 External connection

I claim:

1. A power semiconductor module comprising:
   a plurality of electrically interconnected submodules accommodating power semiconductor chips;
   a common baseplate on which the submodules are arranged next to one another;
   conductors in the form of plates for externally connecting the submodules to power supply lines in a low-inductance manner;
   wherein the submodules are arranged in a close-packed manner on the common baseplate, in that the conductors in the form of plates are each arranged in a self-supporting manner in separate planes above the submodules, which planes have a vertical separation from one another and from the submodules which is sufficient for electrical insulation, and in that each conductor in the form of a plate is electrically connected to one type of semiconductor chip contact on a respective submodules via vertical conduction elements which include sheet-metal strips.

2. A power semiconductor module according to claim 1, wherein each sheet-metal strip comprises a main body which extends in a plane of one conductor in the form of a plate and has lateral portions for contacting several of the power semiconductor chips, which lateral portions are stretched out vertically.

3. A power semiconductor module according to claim 2, wherein the lateral portions of the sheet-metal strips have curves which permit them to compensate for a thermally induced expansion of at least one of the submodules and common baseplate in two independent directions.

4. A power semiconductor module according to claim 3, wherein at least one sheet-metal strip has a U-shaped main body with downwards oriented portions that each turn into horizontal first portions, which have second portions formed on their transverse sides.

5. A power semiconductor module according to claim 3, wherein at least one sheet-metal strip has an elongated main body, on long sides of which groups of portions extend downwards and turn into horizontal feet, which groups of portions are subdivided into narrow segments.

6. A power semiconductor module according to claim 3, wherein the sheet-metal strips are connected to the conductors in the form of plates and to the submodules by soldered joints.

7. A power semiconductor module according to claim 3, wherein conductors in the form of plates except an uppermost conductor are provided with perforations through which are routed vertical conduction elements for connection of the submodules to the conductors in the form of plates situated above the submodules.

8. A power semiconductor module according to claim 3, wherein the submodules together with associated conductors in the form of plates and the vertical conduction elements are arranged in a housing and are potted with an electrically insulating compound.

9. A power semiconductor module according to claim 2, wherein the sheet-metal strips are connected to the conductors in the form of plates and to the submodules by soldered joints.

10. A power semiconductor module according to claim 9, wherein conductors in the form of plates except an uppermost conductor are provided with perforations through which are routed vertical conduction elements for connection of the submodules to the conductors in the form of plates situated above the submodules.

11. A power semiconductor module according to claim 9, wherein the submodules together with associated conductors in the form of plates and the vertical conduction elements are arranged in a housing and are potted with an electrically insulating compound.

12. A power semiconductor module according to claim 2, wherein conductors in the form of plates except an uppermost conductor are provided with perforations through which are routed vertical conduction elements for connection of the submodules to the conductors in the form of plates situated above the submodules.

13. A power semiconductor module according to claim 2, wherein the submodules together with associated conductors in the form of plates and the vertical conduction elements are arranged in a housing and are potted with an electrically insulating compound.

14. A power semiconductor module according to claim 1, wherein the conductors in the form of plates except an uppermost conductor are provided with perforations through which are routed vertical conduction elements for connection of the submodules to the conductors in the form of plates situated above the submodules.

15. A power semiconductor module according to claim 14, wherein the submodules together with associated conductors in the form of plates and the vertical conduction elements are arranged in a housing and are potted with an electrically insulating compound.

16. A power semiconductor module according to claim 1, wherein the submodules together with associated conductors in the form of plates and the vertical conduction elements are arranged in a housing and are potted with an electrically insulating compound.

17. A power semiconductor module according to claim 1, wherein each submodule has an insulating substrate, which comprises a ceramic and is provided with a metallization layer on a top side, and in that a plurality of power semiconductors in chip form are arranged on the metallization layer and are electrically conductively connected to the metallization layer at an underside.

18. A power semiconductor module according to claim 17, wherein at least two of the power semiconductors of a submodule are controlled via two respective gates, and in that the gates are connected to a common gate element which is arranged between the power semiconductors on the substrate and can be externally connected.

19. A power semiconductor module according to claim 18, wherein the connection of the gates to the gate element takes place via individual gate resistors arranged on the gate element.

20. A power semiconductor module according to claim 18, wherein the power semiconductors which can be controlled via a gate are designed as insulated gate bipolar transistors and the remaining power semiconductors are designed as diodes.

* * * * *